US011367396B2

(12) United States Patent
Li et al.

(10) Patent No.: US 11,367,396 B2
(45) Date of Patent: Jun. 21, 2022

(54) PIXEL DRIVING CIRCUIT, DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Huijun Li, Beijing (CN); Tingliang Liu, Beijing (CN); Yonglin Guo, Beijing (CN); Huijuan Yang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/114,907

(22) Filed: Dec. 8, 2020

(65) Prior Publication Data
US 2021/0174744 A1    Jun. 10, 2021

(30) Foreign Application Priority Data
Dec. 10, 2019 (CN) .......................... 201922207474.4

(51) Int. Cl.
*G09G 3/3258* (2016.01)
*G09G 3/3233* (2016.01)
*H01L 27/12* (2006.01)

(52) U.S. Cl.
CPC ......... *G09G 3/3258* (2013.01); *G09G 3/3233* (2013.01); *H01L 27/124* (2013.01);
(Continued)

(58) Field of Classification Search
CPC .. G09G 3/3266; G09G 3/3677; G09G 3/3674; G09G 3/3258; G09G 3/3233; G09G 3/20; G09G 2300/0408; G09G 2300/0426; G09G 2300/0819; G09G 2310/08; G09G 2310/0286; G09G 2320/0247;
(Continued)

(56) References Cited

U.S. PATENT DOCUMENTS

2013/0328853 A1* 12/2013 Hong .................. H01L 27/3265
345/212
2014/0320544 A1* 10/2014 Kim ..................... G09G 3/3233
345/82

(Continued)

*Primary Examiner* — Nitin Patel
*Assistant Examiner* — Amen W Bogale
(74) *Attorney, Agent, or Firm* — Nath, Goldberg & Meyer; Joshua B. Goldberg

(57) ABSTRACT

The present disclosure provides a pixel driving circuit, a display panel and a display apparatus. The pixel driving circuit includes: a first connection line, a second power supply line and a data writing unit. The first connection line is coupled to a gate of at least one transistor in the data writing unit. The first connection line includes at least a first section and a second section coupled to each other, a width of the first section is greater than a width of the second section, and an orthographic projection of the first connection line on the substrate and an orthographic projection of the second power supply line on the substrate overlap with each other to form a first overlapping region, and the first section extends through the first overlapping region.

18 Claims, 3 Drawing Sheets

(52) U.S. Cl.
CPC .............. *G09G 2300/0426* (2013.01); *G09G 2300/0809* (2013.01); *G09G 2320/0233* (2013.01)

(58) Field of Classification Search
CPC ... G09G 2320/0257; G09G 2320/0233; G09G 2320/0223; H01L 27/124; H01L 27/3276; H01L 27/3265; H01L 27/326; H01L 27/3248; H01L 27/3262; H01L 27/1222; H01L 51/5212
See application file for complete search history.

(56) References Cited

U.S. PATENT DOCUMENTS

| | | | |
|---|---|---|---|
| 2015/0102303 A1* | 4/2015 | Kim | H01L 27/3262 257/40 |
| 2018/0158417 A1* | 6/2018 | Xiang | G09G 3/3233 |
| 2020/0098843 A1* | 3/2020 | Jeon | H01L 27/3265 |
| 2020/0144352 A1* | 5/2020 | Lee | G09G 3/3225 |
| 2020/0286975 A1* | 9/2020 | Na | H01L 27/323 |
| 2021/0151542 A1* | 5/2021 | Choe | H01L 27/3272 |
| 2021/0287610 A1* | 9/2021 | Kim | G09G 3/3233 |

* cited by examiner

PIXEL DRIVING CIRCUIT, DISPLAY PANEL AND DISPLAY APPARATUS

CROSS-REFERENCE TO RELATED APPLICATIONS

The present application claims the priority of the Chinese Patent Application No. 201922207474.4, filed on Dec. 10, 2019, the content of which is incorporated herein by reference in its entirety.

TECHNICAL FIELD

The disclosure relates to the field of display technology, and particularly relates to a pixel driving circuit, a display panel and a display apparatus.

BACKGROUND

With the development of science and technology, a full screen terminal (such as a mobile phone) attracts more and more attention. In a full screen terminal in the related art, the number of pixels in a region of a display screen (an irregular-shaped region) is generally smaller than that in the other region of the display screen (a regular-shaped region), so as to ensure that the structures such as a front camera and a receiver could be arranged in the irregular-shaped region.

SUMMARY

According to an aspect of the disclosure, a pixel driving circuit is provided. The pixel driving circuit includes: a substrate, and a driving unit, a light emitting unit, a storage unit, a reset unit, a light emitting control unit, a data writing unit, a second power supply line and a first connection line on the substrate, wherein the driving unit, the storage unit, the data writing unit and the reset unit are coupled to a first node, the driving unit, the light emitting control unit and the data writing unit are coupled to a second node, and the driving unit, the light emitting control unit and the data writing unit are coupled to a third node; the reset unit is configured to adjust a voltage of the first node according to a voltage provided by a first voltage terminal; a first terminal of the storage unit is coupled to the first node, and a second terminal of the storage unit is coupled to a second voltage terminal and then is coupled to the second power supply line; the driving unit is configured to drive the light emitting unit to emit light; the data writing unit is configured to write a data signal supplied from a data line terminal to the driving unit by the adjustment of the storage unit; and the light emitting control unit is configured to write a display current to the light emitting unit by controlling the driving unit; wherein the first connection line is coupled to a gate of at least one transistor in the data writing unit, the first connection line comprises at least a first section and a second section coupled to each other, a width of the first section is greater than a width of the second section, the second power supply line and the first connection line are in different layers, an orthographic projection of the first connection line on the substrate and an orthographic projection of the second power supply line on the substrate overlap with each other to form a first overlapping region, and the first section extends through the first overlapping region.

Optionally, the reset unit includes a first transistor, wherein a first electrode of the first transistor is coupled to the first node, a second electrode of the first transistor is coupled to the first voltage terminal, and a gate of the first transistor is coupled to a reset terminal through a second connection line, and the second connection line and the second power supply line are in different layers, an orthographic projection of the second connection line on the substrate and the orthographic projection of the second power supply line on the substrate overlap with each other to form a second overlapping region, a width of the second connection line in the second overlapping region is greater than a width of the gate of the first transistor.

Optionally, the at least one transistor in the data writing unit includes: a second transistor and a third transistor, a gate of the second transistor is coupled to the first connection line, a first electrode of the second transistor is coupled to the first node, and a second electrode of the second transistor is coupled to the second node, a gate of the third transistor is coupled to the first connection line, a first electrode of the third transistor is coupled to the third node, and a second electrode of the third transistor is coupled to the data line terminal, the second section is between the gate of the second transistor and the first section; and the gate of the third transistor is within the first section.

Optionally, the light emitting control unit includes a fourth transistor, a gate of the fourth transistor is coupled to a signal terminal, a first electrode of the fourth transistor is coupled to the second voltage terminal, and a second electrode of the fourth transistor is coupled to the third node; and a fifth transistor, wherein a gate of the fifth transistor is coupled to the signal terminal, a first electrode of the fifth transistor is coupled to the second node, and a second electrode of the fifth transistor is coupled to the light emitting unit.

Optionally, the driving unit includes a driving transistor, wherein a gate of the driving transistor is coupled to the first node, a first electrode of the driving transistor is coupled to the third node, and a second electrode of the driving transistor is coupled to the second node.

Optionally, the storage unit includes a storage capacitor, a first terminal of the storage capacitor is coupled to the second voltage terminal, and a second terminal of the storage capacitor is coupled to the first node.

Optionally, the pixel driving circuit further includes a sixth transistor, wherein a gate of the sixth transistor is coupled to a reset terminal of a pixel driving circuits in a next row, a first electrode of the sixth transistor is coupled to the second electrode of the fifth transistor, and the second electrode of the sixth transistor is coupled to the first voltage terminal.

Optionally, the pixel driving circuit further includes at least one compensation capacitor coupled to the first connection line in series.

Optionally, the first connection line is formed integrally with the gate of the second transistor and the gate of the third transistor in the data writing unit as a single piece, and the second connection line is formed integrally with the gate of the first transistor as a single piece.

Optionally, the first transistor, the second transistor, the third transistor, the fourth transistor, the fifth transistor, the sixth transistor, and the driving transistor each are an N-type transistor or a P-type transistor.

According to an aspect of this disclosure, a display panel is provided. The display panel includes a plurality of pixel units. The display panel is divided into an irregular-shaped region and a regular-shaped region. Each of the pixel units in the regular-shaped region includes at least one first pixel driving circuit, and each of the pixel units in the irregular-shaped region includes at least one second pixel driving circuit. Each of the at least one first pixel driving circuit and the at least one second pixel driving circuit includes: a substrate, and a driving unit, a light emitting unit, a storage unit, a reset unit, a light emitting control unit, a data writing unit, a second power supply line and a first connection line on the substrate. The driving unit, the storage unit, the data writing unit and the reset unit are coupled to a first node, the driving unit, the light emitting control unit and the data writing unit are coupled to a second node, and the driving unit, the light emitting control unit and the data writing unit are coupled to a third node; the reset unit is configured to adjust a voltage of the first node according to a voltage provided by a first voltage terminal; a first terminal of the storage unit is coupled to the first node, and a second terminal of the storage unit is coupled to a second voltage terminal and then is coupled to the second power supply line; the driving unit is configured to drive the light emitting unit to emit light; the data writing unit is configured to write a data signal supplied from a data line terminal to the driving unit by adjustment of the storage unit; and the light emitting control unit is configured to write a display current to the light emitting unit by controlling the driving unit. In the at least one second pixel driving circuit, the first connection line is coupled to a gate of at least one transistor in the data writing unit, the first connection line comprises at least a first section and a second section coupled to each other, a width of the first section is greater than a width of the second section, the second power supply line and the first connection line are in different layers, an orthographic projection of the first connection line on the substrate and an orthographic projection of the second power supply line on the substrate overlap with each other to form a first overlapping region. In the at least one first pixel driving circuit, the first connection line is coupled to a gate of at least one transistor in the data writing unit, the second power supply line and the first connection line are in different layers, an orthographic projection of the first connection line on the substrate and an orthographic projection of the second power supply line on the substrate overlap with each other to form a third overlapping region, and an area of the first overlapping region is greater than an area of the third overlapping region.

Optionally, in the at least one second pixel driving circuit, the first section extends through the first overlapping region; and a width of the first section in the at least one second pixel driving circuit is greater than a width of the first connection line in the third overlapping region in the at least one first pixel driving circuit.

Optionally, the reset unit comprises a first transistor, wherein a first electrode of the first transistor is coupled to the first node, a second electrode of the first transistor is coupled to the first voltage terminal, and a gate of the first transistor is coupled to a reset terminal via a second connection line, the second connection line and the second power supply line are in different layers, in the at least one second pixel driving circuit, an orthographic projection of the second connection line on the substrate and the orthographic projection of the second power supply line on the substrate overlap with each other to form a second overlapping region; and in the at least one first pixel driving circuit, an orthographic projection of the second connection line on the substrate and an orthographic projection of the second power supply line on the substrate overlap with each other to form a fourth overlapping region, and an area of the fourth overlapping region is smaller than an area of the second overlapping region.

Optionally, in the at least one second pixel driving circuit, a width of the second connection line in the second overlapping region is greater than a width of the gate of the first transistor.

Optionally, the number of the first pixel driving circuits in the regular-shaped region is more than the number of the pixel driving circuits in the irregular-shaped region.

According to another aspect of the disclosure, a display apparatus is provided. The display apparatus includes the display panel above and a driving circuit for driving the display panel.

BRIEF DESCRIPTION OF THE DRAWINGS

The accompanying drawings are used to provide a further understanding of the invention and constitute a part of the specification, and are used to interpret the invention together with the following specific embodiments, but do not constitute a limitation to the invention. In the drawings.

DETAILED DESCRIPTION

Figure 1A:
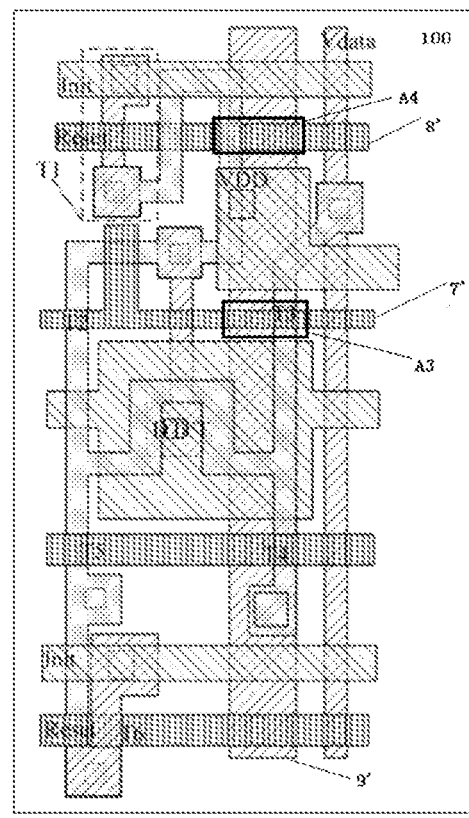
FIG. 1a is a top view of a structure of a pixel driving circuit in an irregular-shaped region of a full screen in the related art.

In order to enable those skilled in the art to better understand the technical solutions of the present disclosure, the present disclosure will be further described in detail below in conjunction with the drawings and specific embodiments.

The present disclosure will be described in more detail below with reference to the drawings. Like elements are denoted by like reference numerals throughout the various drawings. For the sake of clarity, the various parts in the drawings are not drawn to scale. In addition, some well-known parts may not be shown in the drawings.

Numerous specific details of the present disclosure, such as structures, materials, dimensions, treatment processes and techniques, are set forth in the following description, in order to provide a more thorough understanding of the present disclosure. However, as will be understood by those skilled in the art, the present disclosure may be implemented without these specific details.

Figure 1B:
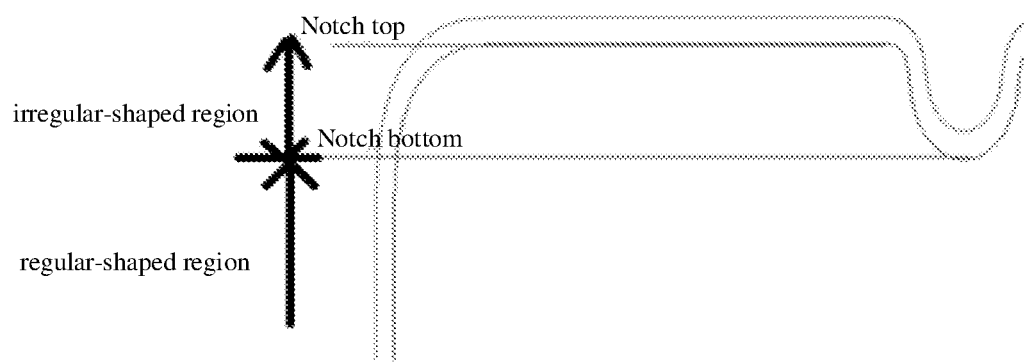
FIG. 1b is a schematic diagram illustrating a layout of a regular-shaped region and an irregular-shaped region in a full screen in the related art.

In a full screen in the related art, a display panel has an irregular-shaped region (may also be referred to as a notch region or a special-shaped region) and a regular-shaped region (may also referred to as a normal region or a main display region), as shown in FIG. 1b. The irregular-shaped region is generally provided with a structure such as a front camera, a receiver and the like, together with pixel units. The regular-shaped region is generally provided with a plurality of pixel units arranged in an array. Therefore, the number of the pixel units in the irregular-shaped region is generally smaller than that in the regular-shaped region (i.e., average number of the pixel units per unit area) to allows the arrangement of the front camera, the receiver and the like. This results in a non-uniform pixel distribution in the display screen and thus an abnormal display in the irregular-shaped region. Each pixel unit is provided with a pixel driving circuit, and the structure of the pixel driving circuit is shown in FIG. 1a as viewed from the top of the display panel.

In order to solve the above problem, a compensation capacitor is generally added to the pixel driving circuit in the irregular-shaped region, which has a compensation effect related to a compensation percentage of the compensation capacitor. The closer the compensation percentage is to 100%, the better the compensation effect is.

As shown in FIG. 1b, the number of the pixel units in each row in the irregular-shaped region gradually increases along a direction from the top (Notch Top) to the bottom (Notch Bottom), resulting in an increasing difference of the load in the pixel driving circuit and thereby a gradual change of brightness of the display panel. In order to compensate for the display difference in the irregular-shaped region, an external capacitor is generally added to the pixel driving circuit in the irregular-shaped region for compensation. The compensation effect is denoted by the compensation percentage, i.e., the closer the compensation percentage is to 100%, and the better the compensation effect is.

Specifically, a GOA (Gate Driver on Array) circuit in the full screen is driven in a bilateral-sides mode. In the irregular-shaped region, the compensation percentages w1 and w2 of the pixel units in the topmost row (i.e., the first row of pixel units, Line 1, at the Notch top) and the pixel units in the bottommost row (i.e., the (X)th row of pixel units, Line X, at the Notch bottom) are calculated as follows:

$$C1 = n1 \times C_{gate} + n2 \times C_{reset} + C_{comp} \times L1,$$
$$C2 = m1 \times C_{gate} + m2 \times C_{reset} + C_{comp} \times L2,$$
$$w1 = \frac{C1}{C3} \times 100\%, w2 = \frac{C2}{C3} \times 100\%,$$

where LineX represents the pixel units in the (X)th row; n1, n2, m1 and m2 respectively represent the total number of the pixel units in the Line1, Line2, Line X and Line (X+1) rows; $C_{gate}$ and $C_{reset}$ respectively represent a gate capacitance and a reset capacitance in one pixel driving circuit in the irregular-shaped region; $C_{comp}$ represents a compensation capacitance; L1 and L2 respectively represent the number of the compensation capacitors of the pixel units in the Line1 row and in the Line X row; and C1, C2 and C3 respectively represent the loads of the GOA circuits of the pixel units in the Line1 row, in the Line X row and in a row in the regular-shaped region.

Since n1<<m1 and n2<<m2, if both w1 and w2 are close to 1, L1>>L2 is required. The abnormal display in the irregular-shaped region often occurs due to insufficient compensation capacitance caused by the space.

Figure 2:
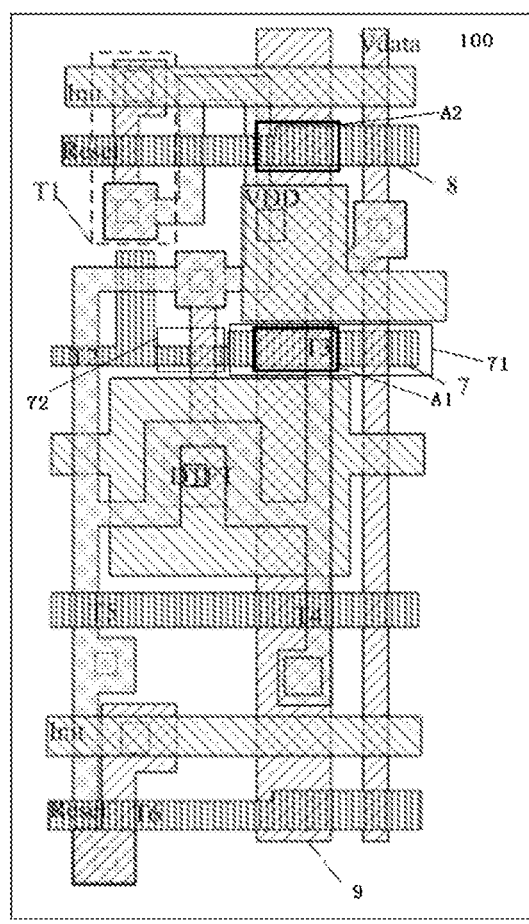
FIG. 2 is a top view of a structure of a pixel driving circuit according to an embodiment of the disclosure.
Figure 3:
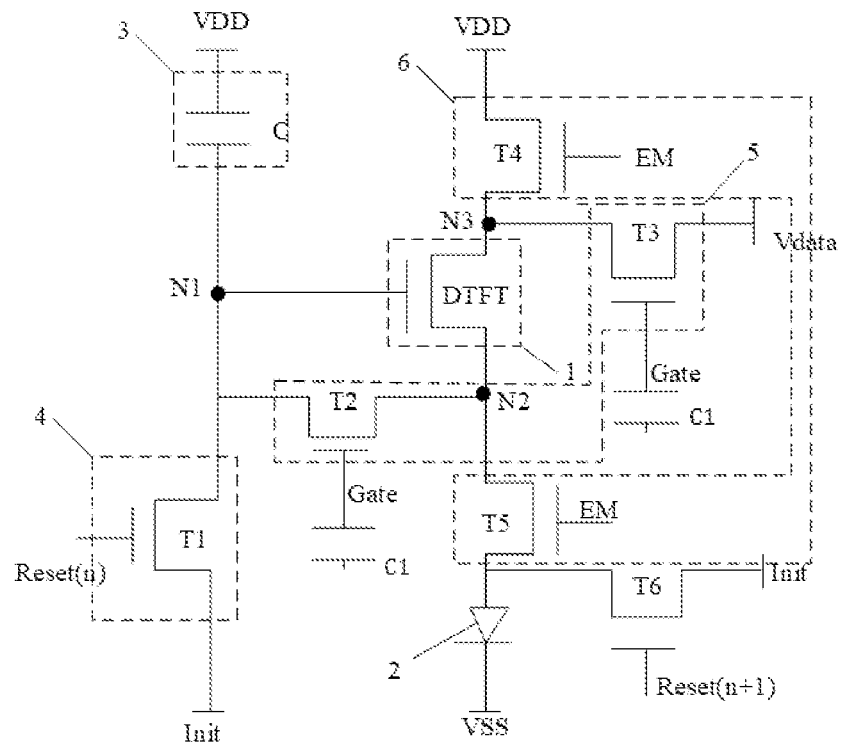
FIG. 3 is a circuit diagram of a pixel driving circuit according to an embodiment of the disclosure.
Figure 4:
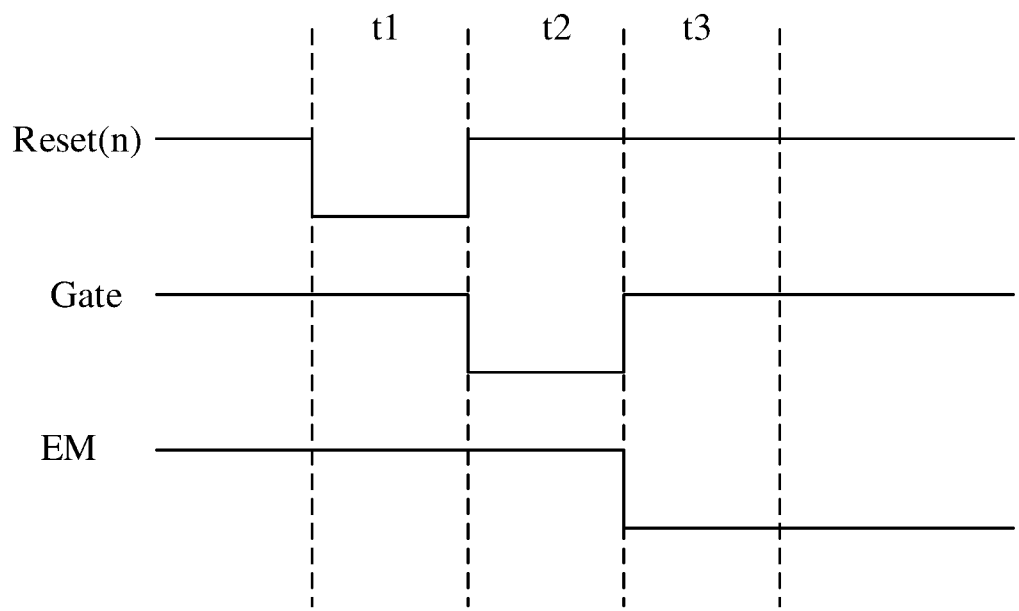
FIG. 4 is a timing diagram illustrating an operation of the pixel driving circuit shown in FIG. 3.

According to an aspect of the present disclosure, a pixel driving circuit is provided. As shown in FIG. 3, the pixel driving circuit includes: a substrate 100, and a driving unit 1, a light emitting unit 2, a storage unit 3, a reset unit 4, a light emitting control unit 6, a data writing unit 5, a second power supply line 9 (as shown in FIG. 2) and a first connection line 7 (i.e., a portion of a gate line) on the substrate 100. The driving unit 1, the storage unit 3, the data writing unit 5, and the reset unit 4 each are coupled to a first node N1. The driving unit 1, the light emitting control unit 6, and the data writing unit 5 each are coupled to a second node N2. The driving unit 1, the light emitting control unit 6, and the data writing unit 5 each are coupled to a third node N3.

As shown in FIG. 3, the reset unit 4 is configured to adjust a voltage of the first node N1 according to a voltage provided by a first voltage terminal Init. A first terminal of the storage unit 3 is coupled to the first node N1, and a second terminal of the storage unit 3 is coupled to a second voltage terminal VDD and then is coupled to the second power supply line 9. The driving unit 1 is configured to drive the light emitting unit 2 to emit light. The data writing unit 5 is configured to write a data signal supplied by a data line terminal Vdata to the driving unit 1 by an adjustment of the storage unit 3 under the control of a gate signal supplied by a gate line terminal. The light emitting control unit 6 is configured to write a display current to the light emitting unit 2 by controlling the driving unit 1.

In the pixel driving circuit of the present embodiment, as shown in FIG. 3, the first connection line 7 is coupled to a gate of the transistor in the data writing unit 5, and the first connection line 7 may be a trace coupled to the gate of each transistor in the data writing unit 5. That is, even when the first connection line 7 and the gate of each transistor in the data writing unit 5 are integrally formed as a gate line, this trace included in the gate line does not denote the gate of the transistor, but may denote a part of the gate line rather than the gate of the transistor.

As shown in FIG. 2, the first connection line 7 includes at least a first section 71 and a second section 72 coupled to each other. A width of the first section 71 is greater than a width of the second section 72. The second power supply line 9 and the first connection line 7 are in different layers. An orthographic projection of the first connection line 7 on the substrate 100 and an orthographic projection of the second power supply line 9 on the substrate 100 overlap with each other to form a first overlapping region A1, and the first section 71 of the first connection line 7 extends through the first overlapping region A1. That is to say, the part of the first connection line 7 in the first overlapping region belongs to or is included in the first section 71.

As shown in FIG. 2, the load of the pixel driving circuit is increased by increasing a width of at least a portion of the first connection line 7 (i.e., the width of the first section 71) to be larger than that of the gate of one transistor (a second transistor T2 as shown in FIG. 2) in the data writing unit 5. Therefore, the problem of the abnormal display in the irregular-shaped region due to insufficient compensation capacitance in the irregular-shaped region of the full screen in the related art can be solved.

That is, the pixel driving circuit in the embodiment can be used in the irregular-shaped region of the full screen. The display effect in the irregular-shaped region is the same as that in the regular-shaped region by widening the first connection line 7. It should be noted that, as the case may be, the abnormal display in the irregular-shaped region can be reduced or even eliminated by merely widening the first connection line 7, or by the combination of widening the first connection line 7 and adding the compensation capacitance.

Specifically, the reset unit 4 includes a first transistor T1. A first electrode of the first transistor T1 is coupled to the first node N1, a second electrode of the first transistor T1 is coupled to the first voltage terminal Init, and a gate of the first transistor T1 is coupled to a reset terminal Reset (n) through a second connection line 8 (a portion of a reset line).

The second connection line 8 is integrally formed with the gate of the first transistor T1 as a single piece and is in a same layer as the gate line.

As shown in FIG. 2, in the irregular-shaped region, the second connection line 8 and the second power supply line 9 are in different layers, and the second connection line 8 and the first connection line 7 are in a same layer. An orthographic projection of the second connection line 8 on the substrate 100 and the orthographic projection of the second power supply line 9 on the substrate 100 overlap with each other to form a second overlapping region A2. A width of the second connection line 8 in the second overlapping region A2 is greater than a width of the gate of the first transistor T1.

As shown in FIG. 2, a capacitance of a capacitor formed by the second connection line 8 and a metal layer thereunder (i.e., the second power supply line 9) is increased by widening the width of the second connection line 8 coupled to the gate of the first transistor T1, thereby increasing the load of the pixel driving circuit, and further the problem of the abnormal display in the irregular-shaped region due to insufficient compensation capacitance in the irregular-shaped region of the full screen in the related art can be solved.

The data writing unit 5 includes a second transistor T2 and a third transistor T3. A gate of the second transistor T2 is coupled to the first connection line 7 through the gate line terminal Gate, a first electrode of the second transistor T2 is coupled to the first node N1 and a second electrode of the second transistor T2 is coupled to the second node N2. A gate of the third transistor T3 is coupled to the first connection line 7 through the gate line terminal Gate, a first electrode of the third transistor T3 is coupled to the third node N3, and a second electrode of the third transistor T3 is coupled to the data line terminal Vdata.

The light emitting control unit 6 includes a fourth transistor T4 and a fifth transistor T5. A gate of the fourth transistor T4 is coupled to a signal terminal EM, a first electrode of the fourth transistor T4 is coupled to the second voltage terminal VDD, and a second electrode of the fourth transistor T4 is coupled to the third node N3. A gate of the fifth transistor T5 is coupled to the signal terminal EM, a first electrode of the fifth transistor T5 is coupled to the second node N2, and a second electrode of the fifth transistor T5 is coupled to the light emitting unit 2. As shown in FIG. 3, the second section 72 is between the gate of the second transistor T2 and the first section 71, and the gate of the third transistor T3 is within the first section 71.

The driving unit 1 includes a driving transistor DTFT. A gate of the driving transistor DTFT is coupled to the first node N1, a first electrode of the driving transistor DTFT is coupled to the third node N3, and a second electrode of the driving transistor DTFT is coupled to the second node N2.

The storage unit 3 includes a storage capacitor C. A first terminal of the storage capacitor C is coupled to the second voltage terminal VDD, and a second terminal of the storage capacitor C is coupled to the first node N1.

Optionally, the pixel driving circuit further includes at least one compensation capacitor C1 coupled to the first connection line 7 in series, as shown in FIG. 3. In this case, the abnormal display in the irregular-shaped region can be reduced or even eliminated by the combination of widening the first connection line 7 and adding the compensation capacitor.

Optionally, the pixel driving circuit further includes a sixth transistor T6. A gate of the sixth transistor T6 is coupled to a reset terminal Reset (n+1) of a pixel driving circuit in a next row, a first electrode of the sixth transistor T6 is coupled to the second electrode of the fifth transistor T5, and a second electrode of the sixth transistor T6 is coupled to the first voltage terminal Init, as shown in FIG. 3. The sixth transistor T6 is used to reset the light emitting unit 2.

The first transistor T1, the second transistor T2, the third transistor T3, the fourth transistor T4, the fifth transistor T5, the sixth transistor T6, and the driving transistor DTFT each are N-type transistors or P-type transistors.

In the embodiment, the second voltage terminal VDD coupled to the second power supply line 9 is used for providing an operating voltage from the second power supply line 9, and the third voltage terminal VSS is used for providing a reference voltage.

It should be noted that, the light emitting unit 2 in the embodiment may include a current-driven light emitting device including an LED (Light Emitting Diode) or an OLED (Organic Light Emitting Diode), and the present embodiment is described by taking the OLED as an example.

Specifically, the driving process of the pixel driving circuit includes three stages S11 to S13.

At the stage S11, i.e., a reset stage t1, a reset signal is input to the first voltage terminal Init, a turn-on signal is input to the reset terminal Reset (n), and a turn-off signal is input to the gate line terminal Gate and the signal terminal EM.

The turn-on signal refers to a signal that can turn on the transistor when applied to the gate of the transistor, and the turn-off signal refers to a signal that can turn off the transistor when applied to the gate of the transistor.

It should be noted that, P-type transistors are taken as examples for all the following transistors, and therefore, the turn-on signal is a low level signal, and the turn-off signal is a high level signal.

In this stage, a high level signal is input to the gate line terminal Gate, and the second transistor T2 and the third transistor T3 are turned off; a high level signal is input to the signal terminal EM, and the fourth transistor T4 and the fifth transistor T5 are turned off; and a low level signal is input to the reset terminal Reset, and the first transistor T1 is turned on, thereby writing the voltage of the first voltage terminal Init into the first node N1.

It should be noted that, in order to facilitate the turning on of the driving transistor DTFT in the next stage, the voltage of the reset signal is at a low level.

Since the gate of the sixth transistor T6 is coupled to the reset terminal Reset (n+1) of the pixel driving circuit in the next row, a start of the display stage of the pixel units in the current row results in a start of the reset stage of the pixel units in the next row.

At the stage S12, i.e., a data writing stage t2, a data signal is input to the data line terminal Vdata, a turn-on signal is input to the gate line terminal Gate, and a turn-off signal is input to the reset terminal Reset and the signal terminal EM.

In this stage, a high level signal is input to the reset terminal Reset, and the first transistor T1 is turned off; a high level signal is input to the signal terminal EM, and the fourth transistor T4 and the fifth transistor T5 are turned off; and a low level signal is input to the gate line terminal Gate, and the second transistor T2 and the third transistor T3 are turned on. Since the first node N1 is at a low level in the previous stage, the driving transistor DTFT is turned on. Thus, the data signal is written to the first node N1 sequentially through the third transistor T3, the driving transistor DTFT, and the second transistor T2.

At the stage S13, i.e., a display stage t3, a display voltage is input to the second voltage terminal VDD, a turn-on signal is input to the signal terminal EM, and a turn-off signal is input to the reset terminal Reset and the gate line terminal Gate.

In this stage, a high level signal is input to the reset terminal Reset, and the first transistor T1 is turned off; a high level signal is to the gate line terminal Gate, and the second transistor T2 and the third transistor T3 are turned off; and a low level signal is input to the signal terminal EM, and the fourth transistors T4 and fifth transistors T5 are turned on. Thus, the display voltage is written to the light emitting unit 2 sequentially through the fourth transistor T4, the driving transistor DTFT, and the fifth transistor T5, such that the light emitting unit 2 can emit light.

According to an aspect of the present disclosure, a display panel is further provided, and the display panel includes a plurality of pixel units. Each of the plurality of pixel units includes a pixel driving circuit. In addition, the display panel is divided into an irregular-shaped region and a regular-shaped region. The at least one pixel driving circuit above shown in FIG. 2 as a second pixel driving circuit is in each of the plurality of pixel units in the irregular-shaped region. Each of the plurality of pixel units in the regular-shaped region includes a first pixel driving circuit.

Specifically, the display panel may be any product or component having a display function, such as an Organic Light Emitting Diode (OLED) display panel, an electronic paper, a mobile phone, a tablet computer, a television, a display, a notebook computer, a digital photo frame, and a navigator.

Further, the display panel includes a first pixel driving circuit in each of the plurality of pixel units in the regular-shaped region. The circuit configuration of the first pixel driving circuit is similar to that of the second pixel driving circuit in the irregular-shaped region. As shown in FIGS. 2 and 3, the first pixel driving circuit includes a substrate 100, and a driving unit 1, a light emitting unit 2, a storage unit 3, a reset unit 4, a light emitting control unit 6, a data writing unit 5, a second power supply line 9' and a first connection line 7' on the substrate 100. The driving unit 1, the storage unit 3, the data writing unit 5, and the reset unit 4 each are coupled to a first node N1. The driving unit 1, the light emitting control unit 6, and the data writing unit 5 each are coupled to a second node N2. The driving unit 1, the light emitting control unit 6, and the data writing unit 5 each are coupled to a third node N3.

The reset unit 4 is configured to adjust a voltage of the first node N1 according to a voltage provided by a first voltage terminal Init. A first terminal of the storage unit 3 is coupled to the first node N1, and a second terminal of the storage unit 3 is coupled to a second voltage terminal VDD and then is coupled to the second power supply line 9'. The driving unit 1 is configured to drive the light emitting unit 2 to emit light. The data writing unit 5 is configured to write a data signal supplied by a data line terminal Vdata to the driving unit 1 by an adjustment of the storage unit 3. The light emitting control unit 6 is configured to write a display current to the light emitting unit 2 by controlling the driving unit 1. The first connection line 7' is coupled to a gate of the transistor in the data writing unit 5. The reset unit 4 includes a first transistor T1. A first electrode of the first transistor T1 is coupled to the first node N1, a second electrode of the first transistor T1 is coupled to the first voltage terminal Init, and a gate of the first transistor T1 is coupled to a reset terminal Reset (n) through a second connection line 8' (a portion of a reset line). The data writing unit 5 includes a second transistor T2 and a third transistor T3. A gate of the second transistor T2 is coupled to the first connection line 7', a first electrode of the second transistor T2 is coupled to the first node N1 and a second electrode of the second transistor T2 is coupled to the second node N2. A gate of the third transistor T3 is coupled to the first connection line 7', a first electrode of the third transistor T3 is coupled to the third node N3, and a second electrode of the third transistor T3 is coupled to the data line terminal Vdata. The light emitting control unit 6 includes a fourth transistor T4 and a fifth transistor T5. A gate of the fourth transistor T4 is coupled to a signal terminal EM, a first electrode of the fourth transistor T4 is coupled to the second voltage terminal VDD, and a second electrode of the fourth transistor T4 is coupled to the third node N3. A gate of the fifth transistor T5 is coupled to the signal terminal EM, a first electrode of the fifth transistor T5 is coupled to the second node N2, and a second electrode of the fifth transistor T5 is coupled to the light emitting unit 2. The driving unit 1 includes a driving transistor DTFT. A gate of the driving transistor DTFT is coupled to the first node N1, a first electrode of the driving transistor DTFT is coupled to the third node N3, and a second electrode of the driving transistor DTFT is coupled to the second node N2. The storage unit 3 includes a storage capacitor C. A first terminal of the storage capacitor C is coupled to the second voltage terminal VDD, and a second terminal of the storage capacitor C is coupled to the first node N1. The first pixel driving circuit further includes a sixth transistor T6. A gate of the sixth transistor T6 is coupled to a reset terminal Reset (n+1) of a pixel driving circuit in a next row, a first electrode of the sixth transistor T6 is coupled to the second electrode of the fifth transistor T5, and a second electrode of the sixth transistor T6 is coupled to the first voltage terminal Init. The pixel driving circuit further includes at least one compensation capacitor C1 coupled to the first connection line 7' in series. The first connection line 7' is formed integrally with the gate of the second transistor T2 and the gate of the third transistor T3 in the data writing unit 5 as a single piece, and the second connection line 8' is formed integrally with the gate of the first transistor T1 as a single piece. The first transistor T1, the second transistor T2, the third transistor T3, the fourth transistor T4, the fifth transistor T5, the sixth transistor T6, and the driving transistor T6 each are an N-type transistor or a P-type transistor.

The difference between the at least one first pixel driving circuit and the at least one second pixel driving circuit lies in the following. In the at least one second pixel driving circuit, the first connection line 7 includes at least a first section 71 and a second section 72 coupled to each other, a width of the first section 71 is greater than a width of the second section 72, an orthographic projection of the first connection line 7 on the substrate and an orthographic projection of the second power supply line 9 on the substrate overlap with each other to form a first overlapping region A1. In the at least one first pixel driving circuit, an orthographic projection of the first connection line 7' on the substrate and an orthographic projection of the second power supply line 9' on the substrate overlap with each other to form a third overlapping region A3. An area of the first overlapping region A1 is greater than an area of the third overlapping region A3, which enables the capacitance formed between the layers where the first connection line 7 and the second power supply line 9 are located in the first overlapping region A1 greater than that in the third overlapping region A3, such that the loads in the regular-shaped region and in the irregular-shaped region can be balanced and the abnormal display in the irregular-shaped region can be reduced or even eliminated.

Optionally, in the at least one second pixel driving circuit, the first section may extend through the first overlapping region A1, that is to say, the part of the first connection line 7 in the first overlapping region A1 belongs to or is included in the first section 71. A width of the first section 71 in the at least one second pixel driving circuit is greater than a width of the first connection line 7' in the third overlapping region A3 in the at least one first pixel driving circuit. Optionally, A width of the second section 72 in the at least one second pixel driving circuit is greater than or equal to a width of the part of the first connection line 7' other than the third overlapping region A3 in the at least one first pixel driving circuit. The above configuration enables the capacitance between the layers in the corresponding overlapping region increase in the irregular region, such that the load in the overlapping region can be increased, the loads in the regular-shaped region and in the irregular-shaped region can be balanced and the abnormal display in the irregular-shaped region can be reduced or even eliminated.

Optionally, in the at least one second pixel driving circuit, an orthographic projection of the second connection line 8 on the substrate 100 and the orthographic projection of the second power supply line 9 on the substrate overlap with each other to form a second overlapping region A2. In the at least one first pixel driving circuit, an orthographic projection of the second connection line 8' on the substrate and an orthographic projection of the second power supply line 9' on the substrate 100 overlap with each other to form a fourth overlapping region A4. An area of the fourth overlapping region A4 is smaller than an area of the second overlapping region A2. Specifically, in the at least one second pixel driving circuit, a width of the second connection line 8 in the second overlapping region A2 is greater than a width of a gate of the first transistor T1. That is to say, the above configuration enables the capacitance between the layers where the second connection line 8 and the second power supply line 9 are located in irregular-shaped region increase, such that the load in the irregular-shaped region can be increased, the loads in the regular-shaped region and in the irregular-shaped region can be balanced and the abnormal display in the irregular-shaped region can be reduced or even eliminated. The first connection line 7', the second connection line 8', the second power supply line 9', the third overlapping region A3 and the fourth overlapping region A4 are similar to those in the related art, as shown in FIG. 1a.

Generally, the widths of the first connection line and/or the second connection line in the first pixel driving circuit in the regular-shaped region may be smaller than that of the first connection line and/or the second connection line in the second pixel driving circuit in the irregular-shaped region. That is, the first pixel driving circuit may have a same width as that of the pixel driving circuit in the related art as shown in FIG. 1a, while the widths of the first connection line and/or the second connection line of the second pixel driving circuit in the irregular-shaped region are larger than the widths of the corresponding first connection line and/or the second connection line in the first pixel driving circuit. Since the number of the first pixel driving circuits in the regular-shaped region in the display panel is generally larger than that of the pixel driving circuits in the irregular-shaped region, the loads in the irregular-shaped region and the regular-shaped region can be balanced by setting the widths of the first connection lines and/or the second connection lines in the first pixel driving circuits to be smaller than that of the first connection lines and/or the second connection lines in the pixel driving circuits in the irregular-shaped region respectively, and the abnormal display in the irregular-shaped region can be reduced or even eliminated.

In the display panel of the embodiment, the load of the pixel driving circuit is increased by widening the width of the first connection line 7 (the width of the first section 71 shown in FIG. 2), and the problem of the abnormal display in the irregular-shaped region due to insufficient compensation capacitance in the irregular-shaped region of the full screen in the related art can be solved. Further, the display in the irregular-shaped region can be normal by the combination of widening the first connection line 7 and adding the compensation capacitor.

In the present disclosure, the load of the pixel driving circuit in the irregular-shaped region is increased by widening the overlapping region between the first connection line 7 and/or the second connection line 8 and the second power supply line 9 in the second pixel driving circuit of the irregular-shaped region, and the load of the second pixel driving circuit in the irregular-shaped region may also be increased by widening other connection lines (such as a signal line, a data line) in the irregular-shaped region, thereby achieving a normal display in the irregular-shaped region.

According to an aspect of the present disclosure, a display apparatus is further provided, and the display apparatus includes the display panel described above and a driving circuit for driving the display panel. A normal display in the irregular-shaped region of the display apparatus can be realized by adopting the display panel in the above embodiments.

It should be noted that, relationship terms such as first and second, and the like are merely used to distinguish one entity or action from another entity or action without necessarily requiring or implying any actual relationship or order between the entities or actions. Also, the terms "comprise," "include," or any other variation thereof, are intended to cover a non-exclusive inclusion, such that a process, method, article, or apparatus that comprises a list of elements not only includes those elements but also other elements not expressly listed or elements inherent to such process, method, article, or apparatus Without further limitation, an element defined by the phrase "comprising an" does not exclude the presence of other identical elements in the process, method, article, or apparatus that comprises the element.

In accordance with the embodiments of the present disclosure, as set forth above, these embodiments are not intended to be exhaustive or to limit the disclosure to the precise embodiments described. Obviously, many modifications and variations are possible in light of the above description. The embodiments were chosen and described in order to best explain the principles of the disclosure and the practical application, to thereby enable others skilled in the art to best utilize the disclosure and modified applications based on the present disclosure. The present disclosure is to be defined only by the claims and their full scope and equivalents.

What is claimed is:

1. A pixel driving circuit, comprising: a substrate, and a driving unit, a light emitting unit, a storage unit, a reset unit, a light emitting control unit, a data writing unit, a second power supply line and a first connection line on the substrate, wherein the driving unit, the storage unit, the data writing unit and the reset unit are coupled to a first node, the driving unit, the light emitting control unit and the data writing unit are coupled to a second node, and the driving unit, the light emitting control unit and the data writing unit are coupled to a third node;

the reset unit is configured to adjust a voltage of the first node according to a voltage provided by a first voltage terminal;

a first terminal of the storage unit is coupled to the first node, and a second terminal of the storage unit is coupled to a second voltage terminal and then is coupled to the second power supply line;

the driving unit is configured to drive the light emitting unit to emit light;

the data writing unit is configured to write a data signal supplied from a data line terminal to the driving unit by adjustment of the storage unit; and the light emitting control unit is configured to write a display current to the light emitting unit by controlling the driving unit;

wherein the first connection line is coupled to a gate of at least one transistor in the data writing unit, the first connection line comprises at least a first section and a second section coupled to each other, a width of the first section is greater than a width of the second section, the second power supply line and the first connection line are in different layers, an orthographic projection of the first connection line on the substrate and an orthographic projection of the second power supply line on the substrate overlap with each other to form a first overlapping region, and the first section extends through the first overlapping region;

the reset unit comprises a first transistor, a first electrode of the first transistor is coupled to the first node, and second electrode of the first transistor is coupled to the first voltage terminal, and a gate of the first transistor is coupled to a reset terminal through a second connection; and the second connection line and the second power supply line are in different layers, an orthographic projection of the second connection line on the substrate and the orthographic projection of the second power supply line on the substrate overlap with each other to form a second overlapping region, and a part of the second connection line in the second overlapping area is a third section of the second connection line, and a part other than the third section of the second connection line is a fourth section of the second connection line, a part of which functions as the gate of the first transistor, and a width of the second connection line in the second overlapping region is greater than a width of the gate of the first transistor.

2. The pixel driving circuit according to claim 1, wherein the at least one transistor in the data writing unit comprises:

a second transistor, wherein a gate of the second transistor is coupled to the first connection line, a first electrode of the second transistor is coupled to the first node, and a second electrode of the second transistor is coupled to the second node;

a third transistor, wherein a gate of the third transistor is coupled to the first connection line, a first electrode of the third transistor is coupled to the third node, and a second electrode of the third transistor is coupled to the data line terminal;

the second section is between the gate of the second transistor and the first section; and the gate of the third transistor is within the first section.

3. The pixel driving circuit according to claim 2, wherein the light emitting control unit comprises:

a fourth transistor, wherein a gate of the fourth transistor is coupled to a signal terminal, a first electrode of the fourth transistor is coupled to the second voltage terminal, and a second electrode of the fourth transistor is coupled to the third node; and a fifth transistor, wherein a gate of the fifth transistor is coupled to the signal terminal, a first electrode of the fifth transistor is coupled to the second node, and a second electrode of the fifth transistor is coupled to the light emitting unit.

4. The pixel driving circuit according to claim 3, wherein the driving unit comprises a driving transistor, wherein a gate of the driving transistor is coupled to the first node, a first electrode of the driving transistor is coupled to the third node, and a second electrode of the driving transistor is coupled to the second node.

5. The pixel driving circuit according to claim 4, wherein the storage unit comprises:

a storage capacitor, wherein a first terminal of the storage capacitor is coupled to the second voltage terminal, and a second terminal of the storage capacitor is coupled to the first node.

6. The pixel driving circuit according to claim 5, further comprising:

a sixth transistor, wherein a gate of the sixth transistor is coupled to a reset terminal of a pixel driving circuit in a next row, a first electrode of the sixth transistor is coupled to the second electrode of the fifth transistor, and the second electrode of the sixth transistor is coupled to the first voltage terminal.

7. The pixel driving circuit according to claim 6, further comprising at least one compensation capacitor coupled to the first connection line in series.

8. The pixel driving circuit according to claim 7, wherein the first connection line is formed integrally with the gate of the second transistor and the gate of the third transistor in the data writing unit as a single piece, and the second connection line is formed integrally with the gate of the first transistor as a single piece.

9. The pixel driving circuit according to claim 8, wherein the first transistor, the second transistor, the third transistor, the fourth transistor, the fifth transistor, the sixth transistor, and the driving transistor each are an N-type transistor or a P-type transistor.

10. A display panel, comprising a plurality of pixel units, the display panel being divided into an irregular-shaped region and a regular-shaped region, each of the pixel units in the regular-shaped region comprising at least one first pixel driving circuit, and each of the pixel units in the irregular-shaped region comprising at least one second pixel driving circuit, wherein each of the at least one first pixel driving circuit and each of the at least one second pixel driving circuit comprise:

a substrate, and a driving unit, a light emitting unit, a storage unit, a reset unit, a light emitting control unit, a data writing unit, a second power supply line and a first connection line on the substrate, wherein the driving unit, the storage unit, the data writing unit and the reset unit are coupled to a first node, the driving unit, the light emitting control unit and the data writing unit are coupled to a second node, and the driving unit, the light emitting control unit and the data writing unit are coupled to a third node;

the reset unit is configured to adjust a voltage of the first node according to a voltage provided by a first voltage terminal;

a first terminal of the storage unit is coupled to the first node, and a second terminal of the storage unit is coupled to a second voltage terminal and then is coupled to the second power supply line;

the driving unit is configured to drive the light emitting unit to emit light;

the data writing unit is configured to write a data signal supplied from a data line terminal to the driving unit by adjustment of the storage unit; and the light emitting control unit is configured to write a display current to the light emitting unit by controlling the driving unit; wherein in the at least one second pixel driving circuit, the first connection line is coupled to a gate of at least one transistor in the data writing unit, the first connection line comprises at least a first section and a second section coupled to each other, a width of the first section is greater than a width of the second section, the second power supply line and the first connection line are in different layers, an orthographic projection of the first connection line on the substrate and an orthographic projection of the second power supply line on the substrate overlap with each other to form a first overlapping region, in the at least one first pixel driving circuit, the first connection line is coupled to a gate of at least one transistor in the data writing unit, the second power supply line and the first connection line are in different layers, an orthographic projection of the first connection line on the substrate and an orthographic projection of the second power supply line on the substrate overlap with each other to form a third overlapping region, and an area of the first overlapping region is greater than an area of the third overlapping region; and the reset unit comprises a first transistor, wherein a first electrode of the first transistor is coupled to the first node, a second electrode of the first transistor is coupled to the first voltage terminal, and a gate of the first transistor is coupled to a reset terminal via a second connection line;

the second connection line and the second power supply line are in different layers;

in the at least one second pixel driving circuit, an orthographic projection of the second connection line on the substrate and the orthographic projection of the second power supply line on the substrate overlap with each other to form a second overlapping region; and a part of the second connection line in the second overlapping area is a third section of the second connection line, and a part other than the third section of the second connection line is a fourth section, a part of which functions as the gate of the first transistor; and in the at least one second pixel driving circuit, a width of the second connection line in the second overlapping region is greater than a width of the gate of the transistor.

11. The display panel according to claim 10, wherein in the at least one second pixel driving circuit, the first section extends through the first overlapping region; and a width of the first section in the at least one second pixel driving circuit is greater than a width of the first connection line in the third overlapping region in the at least one first pixel driving circuit.

12. The display panel according to claim 11, wherein in the at least one first pixel driving circuit, an orthographic projection of the second connection line on the substrate and an orthographic projection of the second power supply line on the substrate overlap with each other to form a fourth overlapping region, and an area of the fourth overlapping region is smaller than an area of the second overlapping region.

13. The display panel according to claim 10, wherein the number of the first pixel driving circuits in the regular-shaped region is more than the number of the pixel driving circuits in the irregular-shaped region.

14. The display panel according to claim 13, wherein the data writing unit comprises:

a second transistor, wherein a gate of the second transistor is coupled to the first connection line, a first electrode of the second transistor is coupled to the first node, and a second electrode of the second transistor is coupled to the second node;

a third transistor, wherein a gate of the third transistor is coupled to the first connection line, a first electrode of the third transistor is coupled to the third node, and a second electrode of the third transistor is coupled to the data line terminal;

the second section is between the gate of the second transistor and the first section; and the gate of the third transistor is within the first section, the light emitting control unit comprises:

a fourth transistor, wherein a gate of the fourth transistor is coupled to a signal terminal, a first electrode of the fourth transistor is coupled to the second voltage terminal, and a second electrode of the fourth transistor is coupled to the third node; and a fifth transistor, wherein a gate of the fifth transistor is coupled to the signal terminal, a first electrode of the fifth transistor is coupled to the second node, and a second electrode of the fifth transistor is coupled to the light emitting unit, the driving unit comprises a driving transistor, wherein a gate of the driving transistor is coupled to the first node, a first electrode of the driving transistor is coupled to the third node, and a second electrode of the driving transistor is coupled to the second node, and the storage unit comprises a storage capacitor, wherein a first terminal of the storage capacitor is coupled to the second voltage terminal, and a second terminal of the storage capacitor is coupled to the first node.

15. The display panel according to claim 14, wherein the pixel driving circuit further comprises:

a sixth transistor, wherein a gate of the sixth transistor is coupled to a reset terminal of a pixel driving circuit in a next row, a first electrode of the sixth transistor is coupled to the second electrode of the fifth transistor, and the second electrode of the sixth transistor is coupled to the first voltage terminal.

16. The display panel according to claim 15, wherein the pixel driving circuit further comprises at least one compensation capacitor coupled to the first connection line in series.

17. The display panel according to claim 16, wherein the first connection line is formed integrally with the gate of the second transistor and the gate of the third transistor in the data writing unit as a single piece, and the second connection line is formed integrally with the gate of the first transistor as a single piece, and the first transistor, the second transistor, the third transistor, the fourth transistor, the fifth transistor, the sixth transistor, and the driving transistor each are an N-type transistor or a P-type transistor.

18. A display apparatus comprising the display panel according to claim 10 and a driving circuit for driving the display panel.

\* \* \* \* \*